United States Patent [19]

Dillard

[11] Patent Number: 5,053,637

[45] Date of Patent: Oct. 1, 1991

[54] COMPUTER FACILITY POWER SYSTEM

[75] Inventor: William T. Dillard, Spartanburg, S.C.

[73] Assignee: Siemens Energy & Automation, Inc., Alpharetta, Ga.

[21] Appl. No.: 359,258

[22] Filed: May 31, 1989

[51] Int. Cl.[5] .............................................. H02B 1/00
[52] U.S. Cl. ....................................... 307/147; 307/42
[58] Field of Search ....................... 307/11, 12, 17, 38, 307/42, 147

[56] References Cited

U.S. PATENT DOCUMENTS

| | | | |
|---|---|---|---|
| 2,798,172 | 7/1957 | Jones | 307/147 |
| 3,781,567 | 12/1973 | Papsco | 307/147 |
| 4,203,053 | 5/1980 | Shepard | 307/147 |
| 4,395,640 | 7/1983 | Bone | 307/147 |

OTHER PUBLICATIONS

"Architectural Power Systems" Manufactured by American Modular Systems Design, Inc., P.O. Box 156, Hudson, NH 03051.
Markting brochure from Nat'l Electrical Manufacturers Assoc., "Busway, The Modern Way to Power Distribution" (1986); pp. 1-19, 2101 L St., N.W., Suite 300; Wash. D.C. 20037.
Bulletin from Siemens Energy & Automation, Inc., "I-T-E XJ-L Busway Systems" (1988) pp. 1-17, Bulletin 5.3-1D.

Primary Examiner—A. D. Pellinen
Assistant Examiner—Jeffrey A. Gaffin
Attorney, Agent, or Firm—James G. Morrow

[57] ABSTRACT

Power is supplied to a computer facility by a plurality of electrical plug-in busways fed by a power distribution unit. The power distribution unit includes circuit breakers for the busways served. Powered equipment is connected by its own power cable to the busways via a plug-in cable tap box having an approprate receptacle for the particular equipment and also housing a circuit breaker dedicated to that equipment.

5 Claims, 1 Drawing Sheet

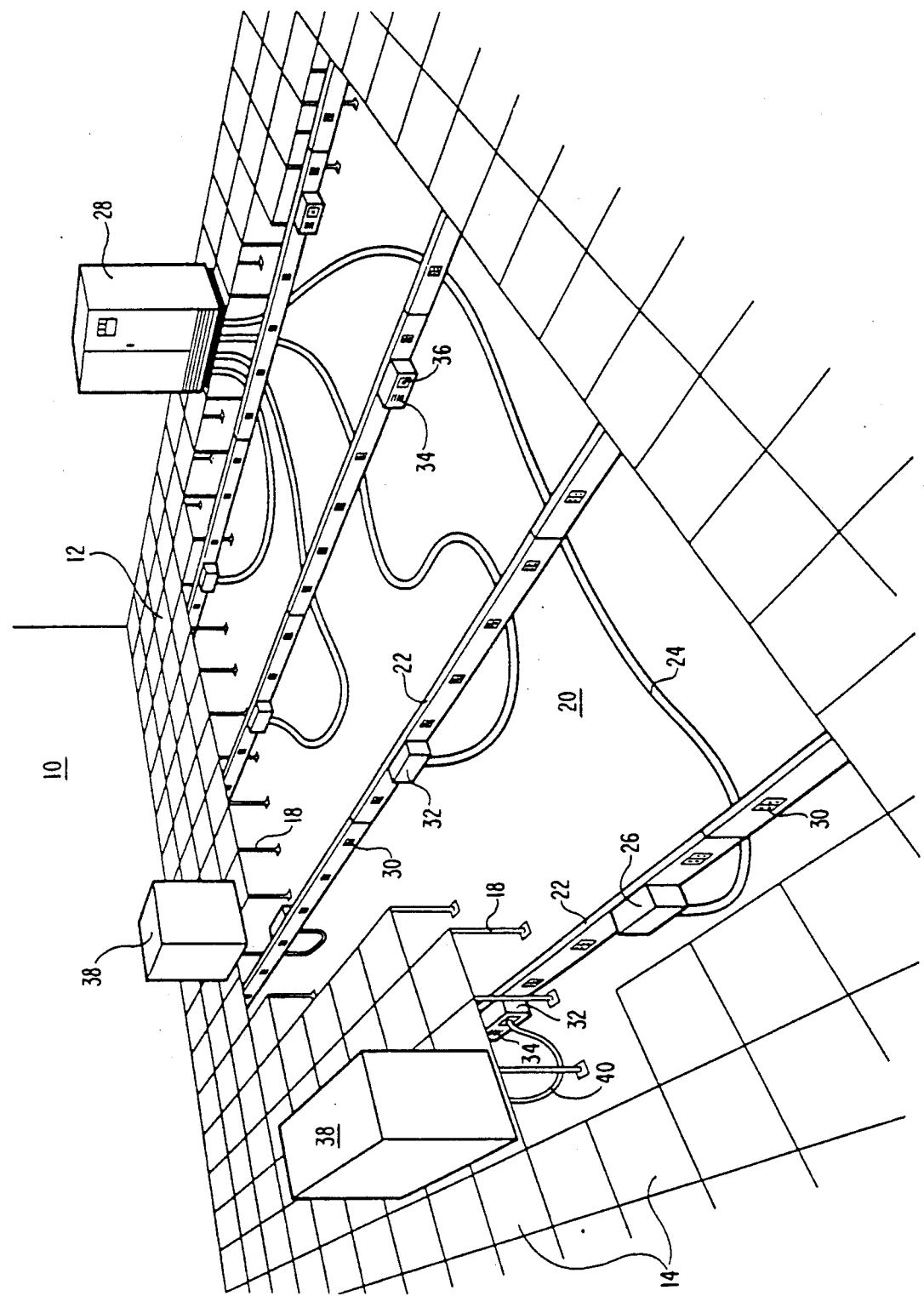

COMPUTER FACILITY POWER SYSTEM

FIELD OF THE INVENTION

The invention relates to power supply systems for computer facilities which include a power distribution unit supplying various computer and peripheral units.

BACKGROUND OF THE INVENTION

A modern computer facility is typically a room with temperature and humidity control and a power distribution system. Signal and power cables are laid beneath a raised floor with removable tiles for access. The power cables from powered units lead to a power distribution unit, which is a three-phase voltage regulator, together with protective circuit equipment housed in a single cabinet. The protective circuit equipment includes circuit breakers for individual powered units, as well as fuses and voltage surge arresters as needed. Power cables pass up through the floor into the bottom of the power distribution unit.

One problem with present power supply arrangements for computer facilities is that the number of cables coming in to the power distribution unit can easily become excessive, leading to difficulty in identifying individual circuit breakers and cables with their associated powered equipment. Installation of additional power cables and corresponding circuit breaker for other equipment becomes increasingly difficult and more of a safety hazard as the cable density beneath the floor and to the power distribution unit increases. There is therefore a need for a computer facility power distribution system which alleviates the problems associated with cable and breaker crowding within the power distribution unit and beneath the raised floor.

SUMMARY OF THE INVENTION

In accordance with the present invention, a power supply system for the distributed load of a computer facility includes a plurality of enclosed electrical plug-in busways beneath the floor which are connected to a power distribution unit. Powered equipment is served by being plugged into the busway via a plug-in cable tap box. In this way the number of cables entering the power distribution unit is minimized, the identification of a breaker serving a particular powered unit is readily established, and the materials and labor needed for adding or removing powered equipment is substantially reduced.

BRIEF DESCRIPTION OF THE DRAWINGS

FIG. 1 of the drawings is an elevated perspective view of a computer facility and power system in accordance with a preferred embodiment of the present invention.

DETAILED DESCRIPTION

In FIG. 1 of the drawings there is shown a distributed load computer facility room 10 having a raised floor assembly 12 constructed of individual floor tiles 14 which are supported above the base floor level by an array of pillars 18 fastened to a base floor 20. A portion of the raised floor assembly 12 is removed in the FIG. 1 to show the structure beneath it. Raised floor systems of this type are well known and readily available commercially.

A plurality of parallel electrical plug-in busways 22 are mounted substantially horizontal between the raised floor 12 and the base floor 20, such as by being fastened to the pillars 18. Of course, busway 22 may deviate substantially from being mounted horizontally where the busway cannot be mounted absolutely horizontal due to installation considerations. Power to the busways 22 is provided through feeder cables 24 connecting to the busways 22 via a cable tap box 26 and connecting at their other end to a power distribution unit 28. The power distribution unit 28 houses a three phase voltage regulator which is protected by the appropriate circuit protection equipment, such as circuit breakers or voltage surge arresters, and also includes a circuit breaker, not shown, for each of the feeder cables 24.

Each of the busways 22 features a plurality of regularly spaced outlet locations 30 along its length, at which a plug-in cable tap box 32 may be plugged into the busway 22 to connect electrically to the internal buses therein. Each plug-in cable tap box 32 includes a circuit breaker 34 connected to serve an outlet receptacle 36. The individual powered equipment units 38 of the distributed load to be served by a busway 22 have their power cords 40 plugged into these outlet receptacles 36.

The busway 22, feeder cable tap boxes 26, plug-in cable tap box 32, circuit breakers 34, receptacles 36, and the power distribution unit 28 may all be provided in the form of commercial equipment readily available and known to those skilled in the art. Therefore, particular features of these items are not detailed further herein.

The arrangement according to the above-described preferred embodiment of the invention provides a number of advantages over previous arrangements, in which powered units were connected directly to a circuit breaker in a power distribution unit. For one, it is seen that the powered unit circuit breaker function is now removed from the power distribution unit and distributed over the system so that it is situated at the powered unit location. This eliminates any possible confusion as to which unit the breaker is serving. It also frees considerable space inside the power distribution unit to either permit a smaller cabinet to be used for a given power distribution unit rating or permits the addition of other features to the unit for which there otherwise would not have been sufficient space. An additional advantage is that the number of cables to the power distribution unit is greatly reduced to thereby eliminate confusion about which circuit breaker in the power distribution unit serves which busway, while also eliminating any labor inside the power distribution unit for the connection or removal of powered units, since this is now carried out at the powered unit location by the plugging of the power cord into a receptacle. The plug-in cable tap boxes can be provided with the appropriate circuit breaker for the powered unit to be connected and can also be provided with the particular outlet receptacle design required for the powered unit, thus eliminating the need for custom power cables adapted specifically for the powered units. Also, labor costs for connections and disconnections are reduced. Finally, by greatly reducing the number of feeder cables on the base floor, the risk of interference with signal cables also resting on the base floor is minimized.

I claim:

1. In a computer facility of the type having a raised floor supported above a base floor to provide a space therebetween for the location of electrical conductors which interconnect with a power distribution unit a distributed load including a plurality of powered units of the facility, the improvement comprising:

at least one substantially horizontal electrical busway mounted under the raised floor, the busway comprising outlet locations for making connection with electrical bus conductors inside it; and electrical feeder conductor means for connecting the buses of each busway to power terminals of the power distribution unit.

2. The apparatus according to claim 1 including at least one plug-in cable box having a receptacle therein for connection thereto of a power cord of powered equipment, and a plug electrically coupled to the busses of the busway at one of the outlet locations and to the receptacle.

3. The apparatus according to claim 2 wherein the electrical feeder conductor means is a cable which is connected to the buses of the busway via a feeder cable tap box with a plug for electrically engaging the buses.

4. The apparatus according to claim 3 wherein the electrical feeder conductor means is a feeder busway.

5. The apparatus according to claim 1, further comprising at least one plug-in cable top box having a plug electrically coupled to the busses of the busway and a circuit breaker.

* * * * *